United States Patent

Campbell, III

[11] 4,081,289
[45] Mar. 28, 1978

[54] SOLAR ENERGY SYSTEM
[76] Inventor: William Patrick Campbell, III, 3310 Rowland Pl., Washington, D.C. 20008
[21] Appl. No.: 644,159
[22] Filed: Dec. 24, 1975
[51] Int. Cl.² ............................................. H01L 31/04
[52] U.S. Cl. ............................... 136/89 PC; 126/270; 126/271
[58] Field of Search ................... 136/89; 126/270, 271
[56] References Cited
U.S. PATENT DOCUMENTS

| 2,402,662 | 6/1946 | Ohl .......................................... 136/89 |
| 2,946,945 | 7/1960 | Regnier et al. ........................ 320/2 |
| 2,989,575 | 6/1961 | Wallace, Jr. ............................ 136/89 |
| 3,279,457 | 10/1966 | Kyryluk ................................ 126/270 |
| 3,866,285 | 2/1975 | Clark ..................................... 29/157 R |
| 3,934,573 | 1/1976 | Dandini ................................. 126/270 |
| 3,960,136 | 6/1976 | Moan et al. .......................... 126/271 |
| 3,988,166 | 10/1976 | Beam ..................................... 136/89 |
| 3,990,914 | 11/1976 | Weinstein et al. ..................... 136/89 |

Primary Examiner—Howard S. Williams
Assistant Examiner—Aaron Weisstuch
Attorney, Agent, or Firm—John S. Roberts, Jr.

[57] ABSTRACT

A system for extracting energy from the sun's rays including a bank of solar energy cells which generate electrical current when exposed to the rays of the sun, immersed in a bath of liquid formed to serve as a lens, concentrating the sun rays on the cells, and transmitting heat away from the cells.

8 Claims, 4 Drawing Figures

SOLAR ENERGY SYSTEM

BACKGROUND OF THE INVENTION

With the advent of the "energy crisis" brought on by the increased per capita consumption of energy and the dwindling reserves of energy sources, a great amount of attention has been devoted to alternate sources of energy. Among these alternate sources is the energy transmitted to or by the sun's rays. Various devices have been built to utilize the energy inherent in the sun's rays in many ways.

Among the leading types of devices for extracting energy from the sun's rays are solar heat panels which utilize the energy present in the infrared portion of the sun's rays to raise the temperature of a liquid such as water.

Prior art is replete with solar heat devices generally including means to focus the sun's rays through mirrors and reflecting bodies onto heat absorption surfaces in order to utilize the energy in the infrared portion to the maximum efficiency. These heat cells generally comprise a transparent surface with a black body heat absorption surface in parallel spaced relation thereto with the liquid to be heated transmitted between these surfaces in heat conductive tubing of copper, aluminum, or the like. The developments in these systems include means to move the panel or cell to track the sun and/or means to focus the sun's rays on the panel through parabolic mirrors set up in appropriate relation to the panel.

Another very important prior art device for extracting energy from the sun's rays is the solar energy panel or cell which utilizes properties of material such as selenium which, when contacted by the sun's rays, emit electrons displaced by photons in the sun's rays to thereby generate electrical current. This type of device has found wide utility in present-day industry, particularly in space where such cells power satellite systems of various types.

Applicant is aware of the following patents in the prior art:

3,279,457 Kyryluk
2,989,575 Wallace
2,312,920 Litton
1,946,184 Abbot
1,855,815 Abbot These references represent the best known prior art known to the applicant. Of these the Kyryluk patent discloses in FIG. 3 a spherical embodiment of a solar heat concentrator which, geometrically, is similar to one embodiment of the applicant's invention; however, there is no intention of incorporating solar cells or a liquid within the sphere. The two Abbot patents disclose solar heaters utilizing glass envelopes around a heat absorbing tube. These references do not contemplate utilizing a liquid within the envelope. The Wallace and Litton patents relate to solar cells, the Litton patent specifically relating to a cooling system or jacket for solar cells. The Litton patent does not contemplate the use of liquid coolant for focusing the sun's rays nor does it contemplate utilization of the coolant as a source of energy itself. Wallace is pertinent only in that it discloses in the embodiment of FIG. 8 thereof a spherical substrate for the solar cells. Other than the geometrical similarity, there is no further relevance of the Wallace reference to the present invention.

SUMMARY OF THE INVENTION

This invention relates to a novel system for extracting energy from the sun's rays which utilizes the best technology of the prior art in a way such that an improved efficiency and increased level of energy is extracted from the sun's rays over that heretofore possible in the prior art.

The invention provides a system which utilizes the extractable electrical potential in the sun's rays in combination with the extractable thermal properties of the sun's rays and the inherent optical properties of the liquid are utilized to receive and transmit the heat energy generated by the system.

This invention also provides a system which increases the extractable electrical energy capability of prior art solar cells by providing a means to concentrate the amount of sunlight impinging on the cell while, at the same time, providing means to preclude overheating of that cell, thereby eliminating the temperature limitation on prior art cells so that it may be operated at much higher energy input levels than heretofore possible.

The invention further provides a system for extracting thermal energy from the sun's rays in a much more efficient manner than the prior art by providing means to focus the sun's rays on the heat-absorbing portion of the panel by forming the heat-transmitting liquid in a geometric configuration which will accomplish such focusing.

In a preferred embodiment, the invention comprises a transparent container configured as a body of rotation, selenium cells disposed in the container at the focal point of the body of revolution, and a liquid filling the container to focus rays of the sun on the selenium cells and to extract and transmit heat from the cells, and means to circulate the liquid in the container and to transmit cold liquid to the container and liquid from the container as it is heated.

These and the other attendant advantages and benefits of the invention will become more apparent to those skilled in the art by reference to the following detailed description wherein like numerals throughout the figures thereof indicate like components and wherein:

DESCRIPTION OF A PREFERRED EMBODIMENT

Figure 1:
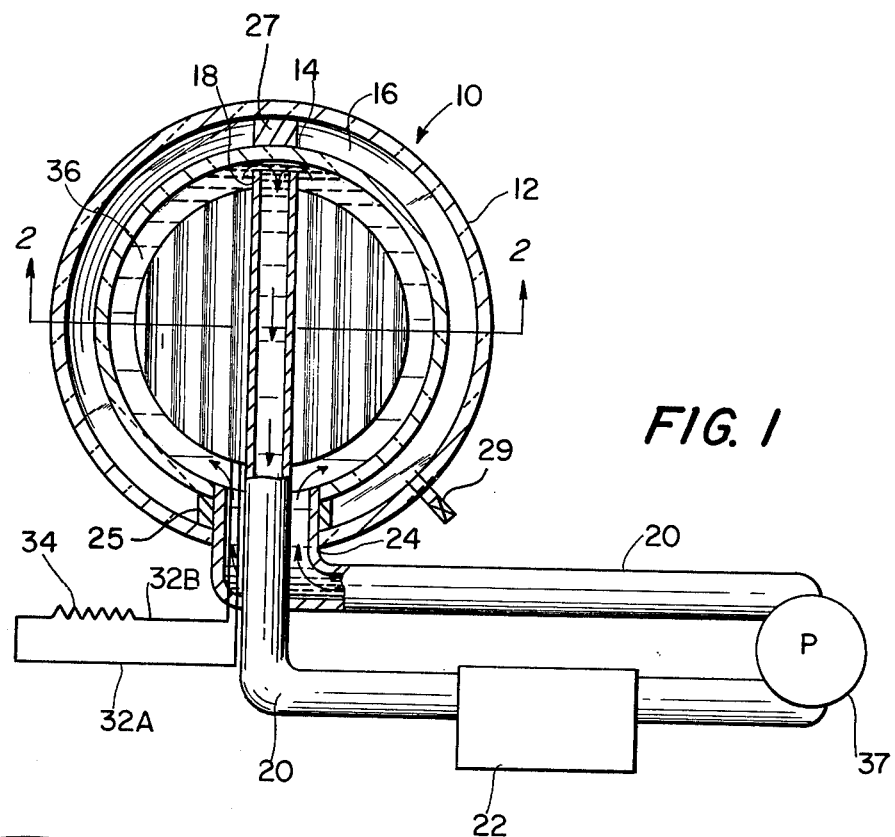
FIG. 1 is a sectional view in elevation of a device in accordance with the invention.

In FIG. 1 the device shown generally at 10 comprises a body of revolution defining a sphere. The device is formed of a pair of shells, outer shell 12 and inner shell 14 mounted in spaced relationship and affixed together to form a gas-tight space 16 therebetween. The space 16 is evacuated to provide an insulating medium between the shells 12 and 14 to insulate the interior of the container formed thereby. The shells 12 and 14 are formed of some transparent material such, for example, as glass or the like.

Figure 2:
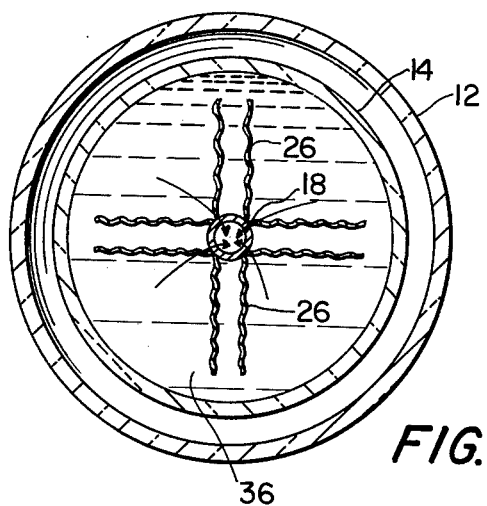
FIG. 2 is a sectional view of the embodiment of FIG. 1 taken along the line 2—2 thereof.

A central tube 18 is disposed along the axis of the housing formed by the shells 12 and 14, existing at the bottom end thereof and connecting with a conduit 20 connected to some load 22 such as a heater, heat exchanger, or storage device. The conduit 20 then returns to the device 10 entering the housing formed by the shells 12 and 14 in an inlet manifold 24 concentrically disposed with respect to the tube 18. As is best seen in FIG. 2, a series of corregated panels 26 are mounted on the tube 18 extending radially therefrom toward the inner shell 14. The panels 26 are semicircular in configuration and are sized to conform closely in spaced relationship to the inner surface of the shell 14.

Figure 3:
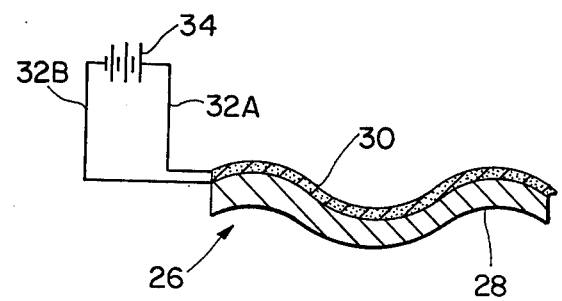
FIG. 3 is an enlarged fragmentary sectional view of a portion of the device of FIG. 1.

As is best seen in FIG. 3, the panels indicated generally there at 26 are composed of a corrugated substrate 28 of some suitable material such, for example, as aluminum, plastic, glass, or the like. Superimposed on the substrate 28 are solar cells 30 composed of a suitable material which will generate electricity when exposed to the rays of the sun such, for example, as selenium, silicon, or the like, as is well known in the art of solar cell fabrication. The cell 30 is preferably composed of a single crystal extruded in corregated sheet form and adhered to the substrate 28 with adhesive or the like. Electrical leads 32A and 32B are connected to the cell 30 and to an electrical load 34 such, for example, as a storage battery or the like.

Referring again to FIG. 1, it can be seen that the leads 32A and 32B are disposed proximate to the tube 18 to exit from the device 10 for connection to the load 34. The leads 32A and 32B are preferably connected through the medium of a bus or collector from each of the panels 26 as is well known in the electrical art.

Structural details of the device include an annular support 25 between the bottom of the shells and a support 27 between the tops of the shells to transfer loads between the sheels and increase the structural efficiency of the device. Evacuation of the space between the shells may be accomplished through valved conduit 29 and may be repeated if need be due to opening of the device.

With the aforedescribed structure complete, the interior of the housing formed by the inner shells 14 is filled with a suitable transparent liquid 36 such, for example, as water.

Pump means 37 are provided in the conduit 20 to circulate the liquid 36 from the tube 18 to the manifold 24.

In operation, the device is exposed to the rays of the sun. The rays of the sun penetrate the transparent shells 12 and 14 and are focused by the liquid 36 within the inner shell onto the solar panels 26, whereupon electrical energy is generated by the impinging sun's rays and is extracted from the device 10 through the leads 32A and 32B to the load 34. The sun's rays impinging on the solar panels also raise the temperature thereof, thereby heating the interior of the shell 14. The insulation provided around the shell 14 by the evacuated space 16 holds the heat generated thereby within the shell and thereby raises the temperature of the liquid 36. Circulation of the liquid by the pump 37 provides withdrawal of heated water through the tube 18 from the top portion of the inner shell 14 and entry of cooled liquid through the manifold 24 at the bottom of the shell. Heat is removed from the circulated liquid 36 by the load 22. The circulation of the liquid thereby provides for removal of useful heat from the device 10 and, at the same time, for cooling of the solar cells 30. The presence of the liquid 36 within the inner shell 14 further provides for optical focusing the sun's rays on the solar panels 26.

Another important feature of the embodiment of FIGS. 1 and 2 is that the spherical configuration can be mounted through the roof of a building in such a way as to function as a skylight, providing a portion of the concentrated light to the interior of a building on which it is mounted.

Figure 4:
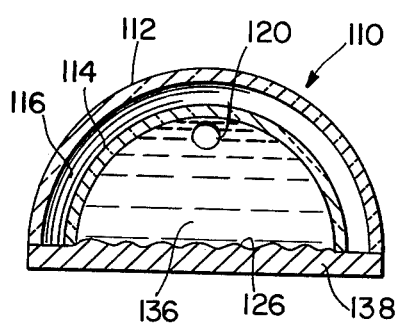
FIG. 4 is a sectional elevational view of another device in accordance with the invention.

In FIG. 4, another embodiment incorporating the features of this invention is illustrated. In this embodiment components thereof corresponding to like components of the embodiments of FIGS. 1-3 are indicated by like numerals only of the next higher order. In this embodiment, the body of revolution comprises a semicylindrical housing formed of an outer shell 112 and an inner shell 114 comprising a transparent material with a sealed space 116 therebetween, which space is evacuated to form an insulating vacuum as in the embodiment of the preceding figures.

Within the housing formed by the shells 114 and 112, and forming a bottom surface thereto, is a solar panel 126 formed, as in the preceding embodiment, on a substrate of corregated material as was shown specifically in FIG. 3.

The interior of the housing formed by the inner and outer shells 114 and 112 is filled with a liquid 136 which, as in the preceding embodiment, preferably is water or the like. Inlet and outlet connections are provided at the lower and upper areas of the housing, respectively, to provide for circulation of the liquid 136 through the housing. A lower inlet (not shown) and an upper inlet 120 are preferably provided in opposite ends of the housing formed by the shells 112 and 114. An insulating material 138 such, for example, as urethane foam or the like is disposed beneath the panel 126 to provide complete insulation for the device 110.

The device of the embodiment of FIG. 4 functions in substantially the same manner as that described for the embodiment of the preceding figures. The sun's rays penetrate the transparent shells 112 and 114 and are focused by the liquid 136 within the inner shell 114 to concentrate on the solar panel 126, whereby electrical and thermal energy is produced and transmitted from the housing in a manner identical to that of the embodiments described in FIGS. 1-3.

As can be seen from the aforegoing description, the invention provides a combined solar electrical and solar thermal generating system utilizing a liquid for focusing the sun's rays, cooling the electrical generating panels, and for transmitting the thermal heat generated from the system.

What has been set forth above is intended primarily as exemplary of a teaching in accordance with the invention to aid those skilled in the art in the practice thereof. What is new and desired to be protected by Letters Patent of the United States is:

1. A system for extracting energy from the sun's rays comprising:
 a pair of spaced concentric walls defining a transparent container describing a body of revolution, the space between said walls being sealed and evacuated to reduce thermal transmission thereacross;
 solar cell means disposed in said container at the focal point of the body of revolution described by said container to generate an electrical current when exposed to solar radiation;
 liquid means filling said container for immersing and cooling said solar cell means and for focusing said solar radiation incident on said container on said solar cell means; and circulation means for transmitting cooled liquid to said container, for circulating liquid in said container, and for transmitting heated liquid from said container.

2. The device in accordance with claim 1 wherein said body of revolution comprises a sphere and wherein said walls comprise concentric spherical walls.

3. The system in accordance with claim 1 wherein said body of revolution describes a semicylindrical housing and wherein said walls comprise a pair of semicylindrical walls, planar walls closing the ends of the semicylindrical body, said means for generating electrical current comprising the remaining wall of the semicylindrical container and insulating means behind said means to complete the insulating enclosure for said system.

4. The system in accordance with claim 1 wherein said solar cell means comprises at least one solar cell adhered to a substrate.

5. The system in accordance with claim 4 wherein said substrate is corrugated.

6. The system in accordance with claim 1 wherein said solar cell means comprises pairs of solar cells mounted in parallel, coextensive spaced relationship to one another.

7. The system in accordance with claim 6 further comprising a central outlet tube for said liquid means communicative with and extending into the interior of said container.

8. The system in accordance with claim 7 wherein said pairs of solar cells are mounted to radiate outwardly from said outlet tube and wherein said tube is substantially vertical and enters said container from the bottom such that said liquid rises as it is warmed to be transmitted from said container.

* * * * *